United States Patent [19]

Cuntz et al.

[11] Patent Number: 6,084,776
[45] Date of Patent: Jul. 4, 2000

[54] CONTROL DEVICE, CONSISTING OF AT LEAST TWO HOUSING PARTS

[75] Inventors: Harald Cuntz, Heimsheim; Peter Jares, Sindelfingen; Dieter Karr, Tiefenbronn, all of Germany

[73] Assignee: Robert Bosch GmbH, Stuttgart, Germany

[21] Appl. No.: 08/952,020

[22] PCT Filed: Jul. 6, 1996

[86] PCT No.: PCT/DE96/01212

§ 371 Date: Nov. 5, 1997

§ 102(e) Date: Nov. 5, 1997

[87] PCT Pub. No.: WO97/06658

PCT Pub. Date: Feb. 20, 1997

[30] Foreign Application Priority Data

Aug. 4, 1995 [DE] Germany .......................... 195 28 632

[51] Int. Cl.⁷ .................................................. H05K 7/20
[52] U.S. Cl. ............................ 361/707; 361/715; 361/720
[58] Field of Search ........................... 361/690, 704–705, 361/707–710, 715, 719–721

[56] References Cited

U.S. PATENT DOCUMENTS 5,272,593  12/1993  Jakob et al. .............................. 361/707
5,473,509  12/1995  Schoettl et al. .......................... 361/715
5,497,495  3/1996   Ishikawa et al. ........................ 361/721

FOREIGN PATENT DOCUMENTS

| 4107312 | 9/1992 | Germany . |
| 4222838 | 3/1993 | Germany . |
| 92 00 624 U | 7/1993 | Germany . |
| 4234022 | 4/1994 | Germany . |

*Primary Examiner*—Gregory Thompson
*Attorney, Agent, or Firm*—Michael J. Striker

[57] ABSTRACT

A control device has at least two housing parts, at least one printed circuit board provided with power components and fastened in a peripheral region between the housing parts, the printed circuit board having a layer of a thermally conductive material, the housing parts of the printed circuit board having a first housing part and a second housing part formed so that the first housing part has a bearing face on the at least one printed circuit board which is larger at least in a region of the power components than a bearing face of to the second housing part, the layer being a filler which has good heat conduction and adhesion to the printed circuit board and to the first housing part.

7 Claims, 1 Drawing Sheet

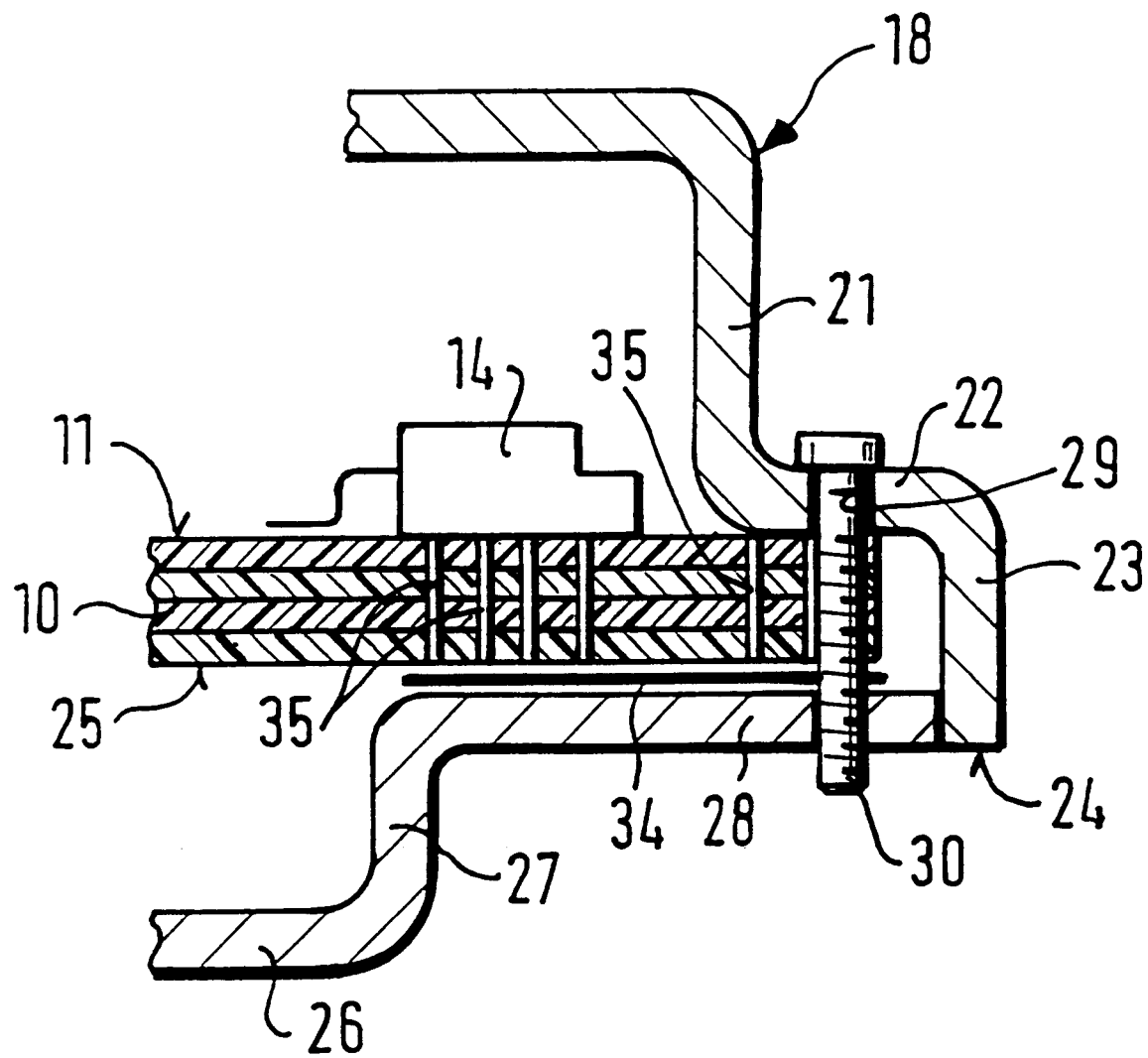

CONTROL DEVICE, CONSISTING OF AT LEAST TWO HOUSING PARTS

BACKGROUND OF THE INVENTION

The invention is based on a control device comprising at least two housing parts. In one control device, known for instance from German Utility Model DE-G bm 92 00 624.8, a printed circuit board or PCB is inserted firmly between two housing parts, that is, a housing cap and a housing bottom, with the aid of screw fastenings. The housing cap and the housing bottom are made of material that is a good heat conductor. To enable dissipating the lost heat of the power components disposed on the PCB via the housing parts, the PCB is provided with a heat-dissipating layer, for example a copper lining, a layer of tin, or a heat-conductive paste. However, modern power components in particular have such a high power loss that with the aid of the conventional heat-dissipating layer and the former structural design, it could be dissipated to the outside only with great difficulty. In other control device concepts, for heat dissipation, the entire underside of the substrate carrying the power components is provided with a heat-dissipating layer. As a result, this side of the PCB can no longer be equipped with power components, and thus more surface area is required, which entails major costs.

SUMMARY OF THE INVENTION

The control device according to the invention as defined by the characteristics of the body of the main claim has the advantage over the prior art that because of the combination according to the invention of a novel adhesive and of the structural design, a relatively high amount of lost heat can be dissipated. Except for the bearing region of the PCB on the one housing part, the PCB can be equipped in a simple way with components on both sides. Standard boards can continue to be used as the PCBs. The adhesive itself is applied to only one housing part, so that the conventional manufacturing process needs to be modified only slightly. Even after the application of the adhesive or in other words before its hardens, the adhesive has such great adhesiveness that it fixes the one housing part and the PCB, or the two parts can be adjusted together. By the combination of the novel adhesive and the modification of the construction of one housing part, heat dissipation is nearly doubled compared with previously known systems. As a result, the PCB can also be equipped with power components that have very great heat loss and thus a high power density. Electrical insulation of the PCB from the housing parts is also assured. By equipping the PCB with components on both sides, an optimal use of surface area and cost minimization are possible.

Further advantages and advantageous features will become apparent from the specification and the drawing.

BRIEF DESCRIPTION OF THE DRAWING

One exemplary embodiment of the invention is shown in the drawing and explained in further detail in the ensuing description. The sole drawing FIGURE is a section taken through a schematic view of part of a control device.

DESCRIPTION OF THE PREFERRED EMBODIMENT

The electrical switching or control device has a PCB 10, on whose top side 11 an electronic circuit is applied, of which only one electronic component 14, which outputs lost heat in operation, is shown. In the drawing, this is shown as an SMD component (surface mounted device). In a manner not shown, the PCB 10 is connected to a plug connector in the conventional way.

The top side 11 of the PCB 10 is covered by a tub-shaped housing cap 18. Except for the region of the plug connector, the housing cap on its side walls 21 has a continuous, collarlike edge 22, which rests on the outer region of the PCB 10. To that end, the PCB 10 is free of circuit components and conductor tracks in the region of its outer edges.

The continuous edge 22 has an edge 23 at an angle, extending parallel to the respective side walls 21 and including the fax ends of the PCB 10. This angled edge 23 may be flush, on its underside 24, with the underside 25 of the PCB 10 or, as shown in the drawing, may protrude past the PCB 10.

The underside 25 of the PCB 10 is enclosed by a likewise tub-shaped housing bottom 26, whose side walls 27 have a continuous, collarlike edge 28 that rests on the outer region of the underside 25 of the PCB 10. The edge 28 is flush here with the edge 23 of the housing cap 18, so that the PCB 10 is enclosed between the housing cap 18 and the housing bottom 26. The edges 22, 28 of the housing cap 18 and housing bottom 26 have a plurality of aligned bores 29, which also penetrate the PCB 10, and into which screws 30 are inserted that firmly connect the housing cap 18, PCB 10 and housing bottom 26 to one another. Instead of the screw fastening of the housing cap 18, PCB 10 and housing bottom 26, these elements may also be firmly connected to one another by means of adhesive bonding, soldering, crimping, riveting, or by means of detent elements or other connecting techniques. The housing cap 18 and the housing bottom 26 are preferably made from a material with good heat conduction.

According to the invention, the bearing face, that is, the edge 28, of the housing bottom 26, is larger than the bearing face, or in other words the edge 22, of the housing cap 18, or vice versa. The bearing face of the housing bottom on the PCB, that is, the edge 28, is large enough that at least the power components 14 with the greatest heat loss can be disposed on the side of the PCB 10 located above this edge or bearing face.

If in the above-described, previously known control devices only the bearing face or in other words the edge 28 of the housing bottom 26 were to be enlarged, and the previously known heat-dissipating layers on the underside of the PCB 10 were retained, this could lead to a worsening in the dissipation of the lost heat from the power components to outside the housing. If the PCB 10 is firmly clamped in place between the housing cap 18 and the housing bottom 26 with the aid of the screw fastening 30, then because of the screw fastening 30, a wedgelike gap can form between the edge 28 and the underside 25 of the PCB 10. This wedgelike gap becomes larger and larger as it extends from the screw fastening 30 to the side walls 27 of the housing bottom 26. The larger this gap, the poorer the heat dissipation between the power component and the housing parts 18 and 26. According to the invention, this gap can be compensated for by using a filler with good thermal conduction and filler 34 adhering to both the underside 25 of the PCB 10 and the edge 28 of the housing bottom 26. What is essential here is that this filler 34 have such highly adhesive properties that upon assembly, that is, when the screw fastening 30 is made, it remains stuck both to the underside 25 of this PCB 10 and to the edge 28 over the entire length of the edge 28, or in other words its bearing face in particular, so that the good thermal conductivity between the PCB 10 and the housing bottom 26 is preserved. To improve the conductivity through the PCB 10, through-plated holes 35 are formed in the PCB 10, in particular below the power component 14; these holes may also be filled with heat-conductive materials in a known manner.

Fillers 34 that may be used are commercially available adhesive films with thermally conductive properties. These films are both electrically insulating and thermally conductive. These adhesives then enable direct adhesive bonding of the PCB 10 to the edge 28 of the housing bottom 26. With these adhesive films, fast and simple processing at room temperature is possible, resulting in an immediate connection of the surfaces. The adhesive film has a good initial adhesive power to keep the two components in their position already. After that, the adhesive has to harden. The final adhesive force can be reached more quickly by pressure and/or heat, because by this additional provision a better flow behavior of the adhesive tapes is attained.

As the adhesive, the adhesive tapes sold by 3M corporation, for example, under the tradename Scotch™ 9882, 9885 and 9890 are suitable.

Alternatively, so-called temperature-curing dual-component adhesive systems may also be used. These are a mixture of a hardener and silicone resin, which are joined to one another by raising the temperature.

If an adhesive is used as the filler 34, then a rigid connection is obtained between the PCB 10 and the housing bottom 26. However, it is also possible to use as the filler an elastic material that has the above-described properties, that is, the thermal conduction properties and the adhesive properties. The electrically insulating properties may be attained for instance by inserting insulating layers into the elastic composition or by appropriate PCB construction. If elastic material is used as the filler 34, then some motion in accordance with the aforementioned gap is possible. However, the thermally conductive contact between the PCB 10 and the edge 28 of the housing bottom 26 is constantly maintained.

The edge 28 of the housing bottom 26 may be embodied as an encompassing edge uniformly on all sides of the housing bottom 26. Here it is at least large enough that the power component 14 having the greatest heat loss can be located in the region of the edge 28. However, it is possible for the edge 28 to be made larger than the bearing face of the housing cap only at some points, where the power components having the very high heat loss are located, thus creating islands on the underside 25 of the PCB 10. In all cases, conventionally known PCBs 10 can be used.

We claim:

1. A control device, comprising at least two housing parts; at least one printed circuit board provided with power components and fastened in a peripheral region between said housing parts, said printed circuit board having a layer of a thermally conductive material, said housing parts having a first housing part and a second housing part formed so that said first housing part has a bearing face on said at least one printed circuit board which is larger at least in a region of said power components located on an edge of said at least one printed circuit board than a bearing face of said second housing part, said layer being a filler which has good heat conduction and adhesion to said printed circuit board and said first housing part.

2. A control device as defined in claim 1, wherein said power components include such power components which have a greatest heat loss and are disposed at an edge of said printed circuit board in a region of said bearing face of said first housing part.

3. A control device as defined in claim 1, wherein said filler is a heat-hardenable filler.

4. A control device as defined in claim 1, wherein said filler is a filler which after hardening has elastic properties.

5. A control device as defined in claim 1, wherein said filler is a filler which has two components and is pressure hardenable.

6. A control device as defined in claim 1, wherein said filler is a filler which has two components and is temperature hardenable.

7. A control device as defined in claim 1, wherein said first housing part, said at least one printed circuit board, and said second housing part are firmly joined with one another.

* * * * *